United States Patent
Hsu et al.

(10) Patent No.: US 8,791,732 B2
(45) Date of Patent: Jul. 29, 2014

(54) PHASE LOCKED LOOP

(75) Inventors: Jui-Lin Hsu, Tainan (TW); Chih-Hsien Shen, Zhubei (TW); Chunwei Chang, Taichung (TW); Jing-Hong Conan Zhan, HsinChu (TW)

(73) Assignee: MediaTek Inc., Hsin-Chu (TW)

( * ) Notice: Subject to any disclaimer, the term of this patent is extended or adjusted under 35 U.S.C. 154(b) by 30 days.

(21) Appl. No.: 13/291,498

(22) Filed: Nov. 8, 2011

(65) Prior Publication Data

US 2012/0286834 A1 Nov. 15, 2012

Related U.S. Application Data

(60) Provisional application No. 61/483,921, filed on May 9, 2011.

(51) Int. Cl.
*H03L 7/06* (2006.01)

(52) U.S. Cl.
USPC .......................................... 327/156; 327/147

(58) Field of Classification Search
CPC .......... H03L 7/0891; H03L 7/18; H03L 7/093
USPC .................................. 327/147, 156
See application file for complete search history.

(56) References Cited

U.S. PATENT DOCUMENTS

| | | | |
|---|---|---|---|
| 5,933,031 A | 8/1999 | Konno | |
| 6,246,864 B1 | 6/2001 | Koike | |
| 6,388,535 B1 | 5/2002 | Otsuki et al. | |
| 7,141,883 B2 | 11/2006 | Wei et al. | |
| 7,319,261 B1 | 1/2008 | Power et al. | |
| 7,599,190 B2 | 10/2009 | Okubora | |
| 8,248,123 B2 * | 8/2012 | Zeller | 327/157 |
| 8,299,826 B2 * | 10/2012 | Perrott | 327/156 |
| 8,306,176 B2 * | 11/2012 | Staszewski et al. | 375/376 |
| 8,339,165 B2 * | 12/2012 | Dunworth et al. | 327/152 |
| 2004/0183156 A1 | 9/2004 | Lowther | |
| 2006/0255413 A1 | 11/2006 | Oh et al. | |
| 2007/0215962 A1 | 9/2007 | Minervini et al. | |
| 2010/0019300 A1 | 1/2010 | Yu et al. | |

(Continued)

FOREIGN PATENT DOCUMENTS

| | | |
|---|---|---|
| CN | 2135787 | 6/1993 |
| CN | 1115522 | 1/1996 |

(Continued)

OTHER PUBLICATIONS

Yu, S.A., et al.; "A 0.042-mm2 Fully Integrated Analog PLL with Stacked Capacitor-Inductor in 45nm CMOS;" pp. 1-4.

(Continued)

*Primary Examiner* — Adam Houston
(74) *Attorney, Agent, or Firm* — McClure, Qualey & Rodack, LLP

(57) ABSTRACT

A phase locked loop is provided. The phase locked loop includes a detector, a controlled oscillator and a filtering unit coupled between the detector and the controlled oscillator. The detector generates a phase difference signal according to a reference frequency and an oscillation signal. The controlled oscillator generates the oscillation signal according to a filtered signal. The filtering unit filters the phase difference signal to generate the filtered signal, and the filtering unit has a high frequency filter of which a pole is greater than the reference frequency and less than a frequency of the oscillation signal.

14 Claims, 9 Drawing Sheets

600

(56) References Cited

U.S. PATENT DOCUMENTS

| | | | |
|---|---|---|---|
| 2010/0072582 A1 | 3/2010 | Chandra et al. | |
| 2010/0248647 A1* | 9/2010 | Wachi | 455/73 |
| 2010/0289541 A1 | 11/2010 | Wu | |
| 2011/0102032 A1 | 5/2011 | Zeller | |
| 2011/0140797 A1* | 6/2011 | Lee | 331/167 |
| 2011/0248787 A1* | 10/2011 | Jiang | 331/117 FE |
| 2012/0280729 A1* | 11/2012 | August et al. | 327/156 |
| 2012/0286391 A1* | 11/2012 | Shen et al. | 257/531 |
| 2012/0286834 A1* | 11/2012 | Hsu et al. | 327/156 |
| 2013/0009279 A1* | 1/2013 | Ding et al. | 257/531 |
| 2013/0093478 A1* | 4/2013 | Wong | 327/156 |
| 2013/0099870 A1* | 4/2013 | Terrovitis | 331/56 |

FOREIGN PATENT DOCUMENTS

| | | |
|---|---|---|
| CN | 1190291 | 8/1998 |
| CN | 1585128 | 2/2005 |
| CN | 101888243 | 11/2010 |
| EP | 0 664 617 | 7/1995 |
| WO | WO 2008/055755 | 5/2008 |

OTHER PUBLICATIONS

English language translation of abstract of CN 2135787 (published Jun. 9, 1993).

English language translation of abstract of CN 1190291 (published Aug. 12, 1998).

* cited by examiner

US 8,791,732 B2

PHASE LOCKED LOOP

CROSS REFERENCE TO RELATED APPLICATIONS

This application claims priority of U.S. Provisional Application No. 61/483,921, filed on May 9, 2011, the entirety of which is incorporated by reference herein.

BACKGROUND OF THE INVENTION

1. Field of the Invention

The invention relates to a phase locked loop (PLL), and more particularly to a PLL for attenuating harmonics.

2. Description of the Related Art

Phase locked loops (PLL) are commonly used in circuits that generate a high-frequency signal with a frequency being an accurate multiple of the frequency of a reference signal. PLLs can also be found in applications where the phase of the output signal has to track the phase of the reference signal, hence the name phase-locked loop. For example, a PLL can be used in a frequency synthesizer of a radio receiver or transmitter for generating a local oscillator signal, which is a multiple of a stable, low-noise and often temperature-compensated reference signal. As another example, a PLL can also be used for clock recovery applications in digital communication systems, disk-drive read-channels, etc.

BRIEF SUMMARY OF THE INVENTION

An embodiment of a phase locked loop is provided. The phase locked loop comprises: a detector, for generating a phase difference signal according to a reference frequency and an oscillation signal; a controlled oscillator, for generating the oscillation signal according to a filtered signal; and a filtering unit coupled between the detector and the controlled oscillator, for filtering the phase difference signal to generate the filtered signal, wherein the filtering unit comprises a high frequency filter of which a pole is greater than the reference frequency and less than a frequency of the oscillation signal.

Furthermore, another embodiment of a phase locked loop is provided. The phase locked loop comprises: a controlled oscillator, for providing an output signal oscillating at a determined output frequency according to a first signal; a divider, for dividing the output signal into a divided frequency; a detector, for generating a phase difference signal according to a reference frequency and the divided frequency; and a filtering unit, for filtering the phase difference signal to generate the first signal, wherein the filtering unit comprises a high frequency filter of which a pole is set between the reference frequency and the determined output frequency.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
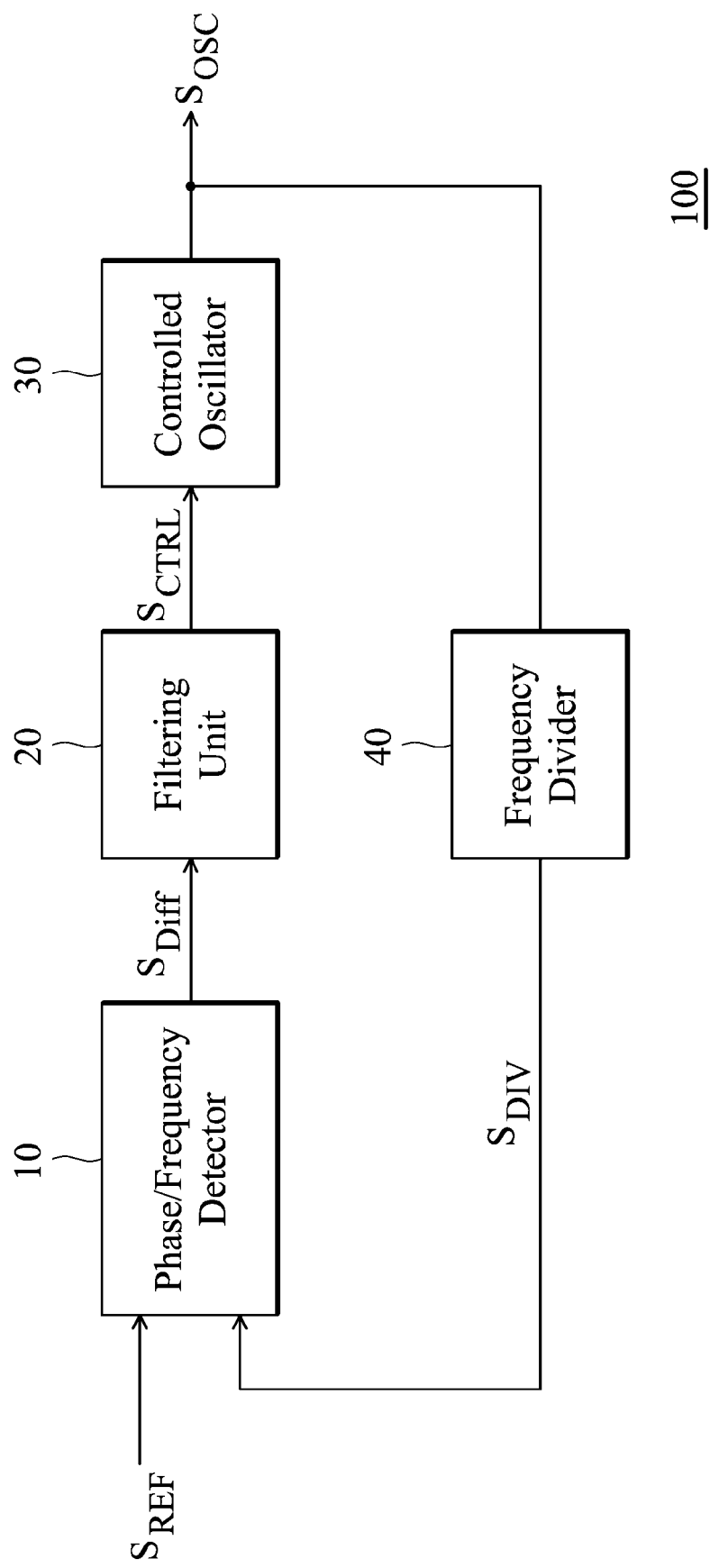
FIG. 1 shows a phase locked loop (PLL) according to an embodiment of the invention.

FIG. 1 shows a phase locked loop (PLL) 100 according to an embodiment of the invention. The PLL 100 comprises a phase/frequency detector 10, a filtering unit 20, a controlled oscillator 30 and a frequency divider 40. The phase/frequency detector 10 receives a reference signal $S_{REF}$ having a reference frequency $f_{REF}$ and a divided signal $S_{DIV}$ from the frequency divider 40, and generates a phase difference signal $S_{Diff}$ according to phase/frequency differences between the reference signal $S_{REF}$ and the divided signal $S_{DIV}$. In one embodiment, the phase/frequency detector 10 further comprises a charge pump for generating the phase difference signal $S_{Diff}$. The filtering unit 20 is coupled to the phase/frequency detector 10, which filters the phase difference signal $S_{Diff}$ to generate a control signal $S_{CTRL}$. The controlled oscillator 30 with variable frequency capability is coupled to the filtering unit 20, which generates an output signal $S_{OSC}$ (i.e. the oscillation signal) having a required periodic frequency $f_{OSC}$ according to the control signal $S_{CTRL}$. Furthermore, the controlled oscillator 30 may be a voltage controlled oscillator (VCO) or a digitally controlled oscillator (DCO) that comprises an LC tank. The frequency divider 40 is coupled between the controlled oscillator 30 and the phase/frequency detector 10, which divides the output signal $S_{OSC}$ into a divided signal $S_{DIV}$. In FIG. 1, reference spurs are caused by the fact that the phase difference signal $S_{Diff}$ of the phase/frequency detector 10 is being continuously updated at the reference frequency $f_{REF}$.

Figure 2:
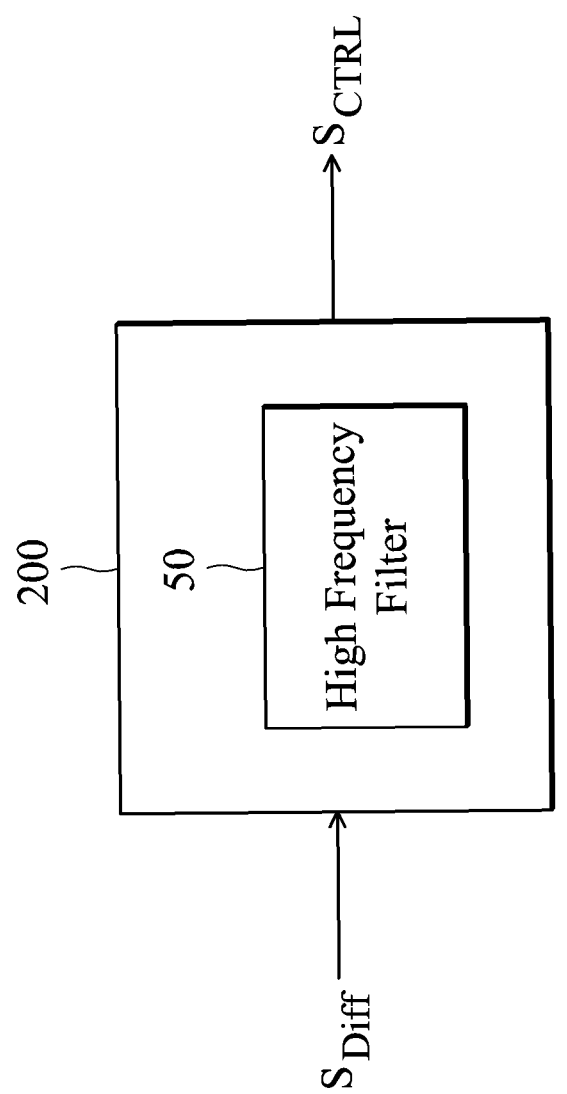
FIG. 2 shows a filtering unit according to an embodiment of the invention.

FIG. 2 shows a filtering unit 200 according to an embodiment of the invention. The filtering unit 200 comprises a high frequency filter 50 having specific frequency characteristics. The high frequency filter 50 provides a pole which can attenuate the harmonics of the reference frequency $f_{REF}$ presented in the phase difference signal $S_{Diff}$. Thus, the harmonics of the reference frequency $f_{REF}$ remained in the control signal $S_{CTRL}$ are also attenuated.

Figure 3:
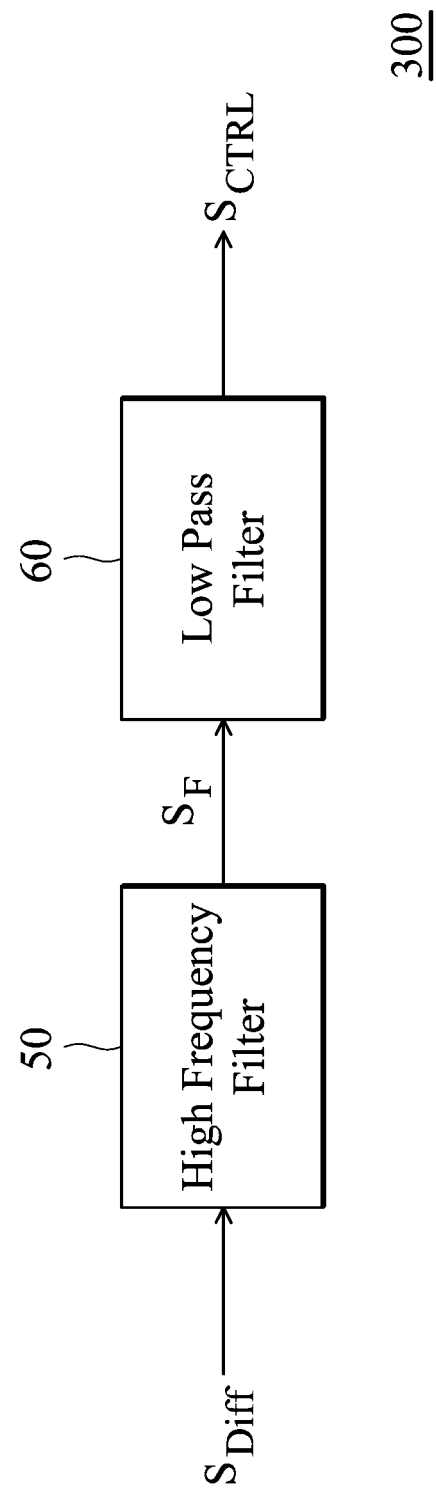
FIG. 3 shows a filtering unit according to another embodiment of the invention.

FIG. 3 shows a filtering unit 300 according to another embodiment of the invention. Compared with the filtering unit 200 of FIG. 2, the filtering unit 300 further comprises a low pass filter 60 coupled between the high frequency filter 50 and the controlled oscillator 30 of FIG. 1. In the filtering unit 300, the high frequency filter 50 provides a pole to attenuate the harmonics of the reference frequency $f_{REF}$ presented in the phase difference signal $S_{Diff}$, so as to generate a signal $S_F$ to the low pass filter 60. The low pass filter 60 filters the signal $S_F$ to generate the control signal $S_{CTRL}$. Thus, the frequency components that typically cause the unwanted spurs occurred in the output signal $S_{OSC}$ of the PLL 100 of FIG. 1 are decreased by the filtering unit 300.

Figure 4A:
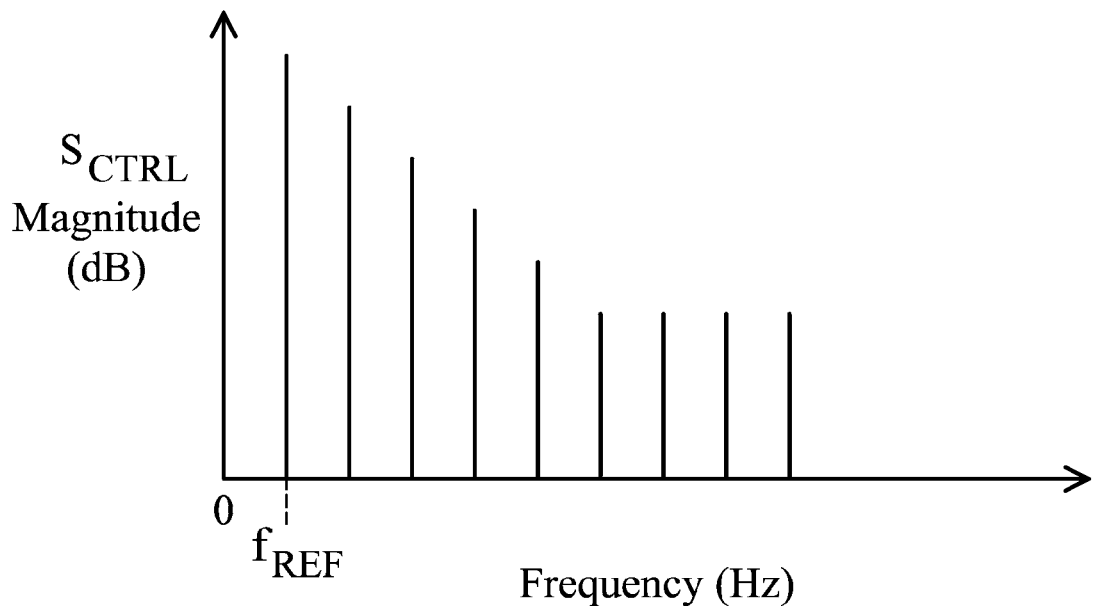
FIG. 4A shows a frequency spectrum of a control signal of a filtering unit that is only implemented by a low pass filter.
Figure 4B:
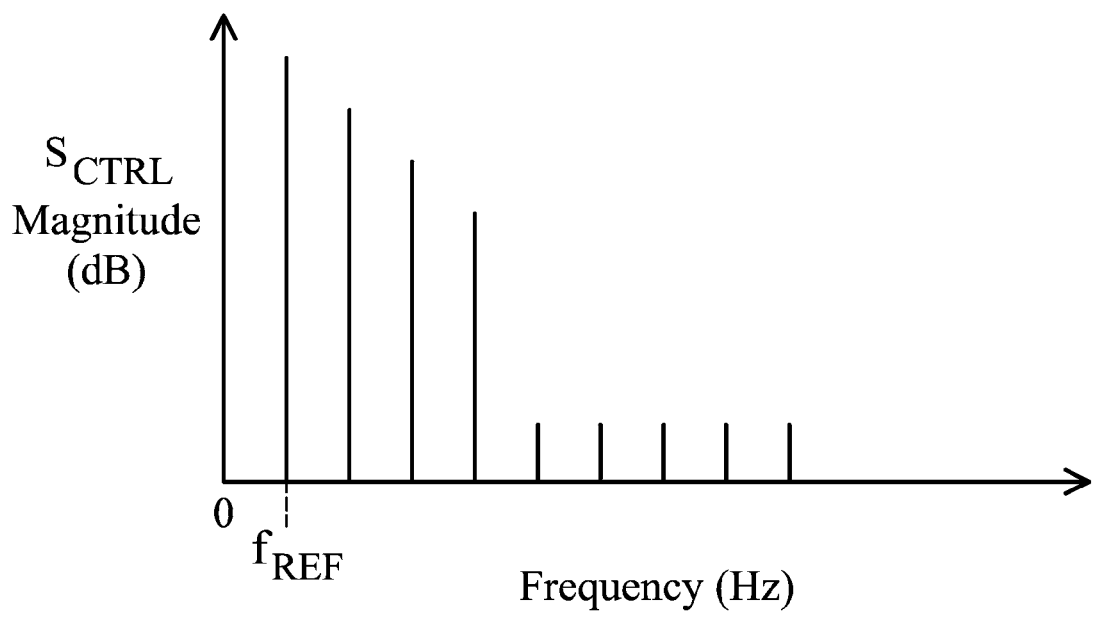
FIG. 4B shows a frequency spectrum of the control signal $S_{CTRL}$ of the filtering unit in FIG. 3.

FIG. 4A and FIG. 4B illustrate an improvement in frequency spectrum that is provided by the high frequency filter 50 of FIG. 3, wherein FIG. 4A shows a frequency spectrum of a control signal $S_{CTRL}$ of a filtering unit that is only implemented by a low pass filter (e.g. 60 of FIG. 3), and FIG. 4B shows a frequency spectrum of the control signal $S_{CTRL}$ of the filtering unit 300 in FIG. 3. Obviously, the harmonics of the reference frequency $f_{REF}$ presented in the control signal $S_{CTRL}$ of FIG. 4B is weaker than that of the control signal $S_{CTRL}$ of FIG. 4A. Therefore, for the PLL 100 of FIG. 1, unwanted spurs occurred in the output signal $S_{OSC}$, of which the frequency is around the frequency of the output signal $S_{OSC}$, can be attenuated by the lower levels of the harmonics of the reference frequency $f_{REF}$.

Figure 5:
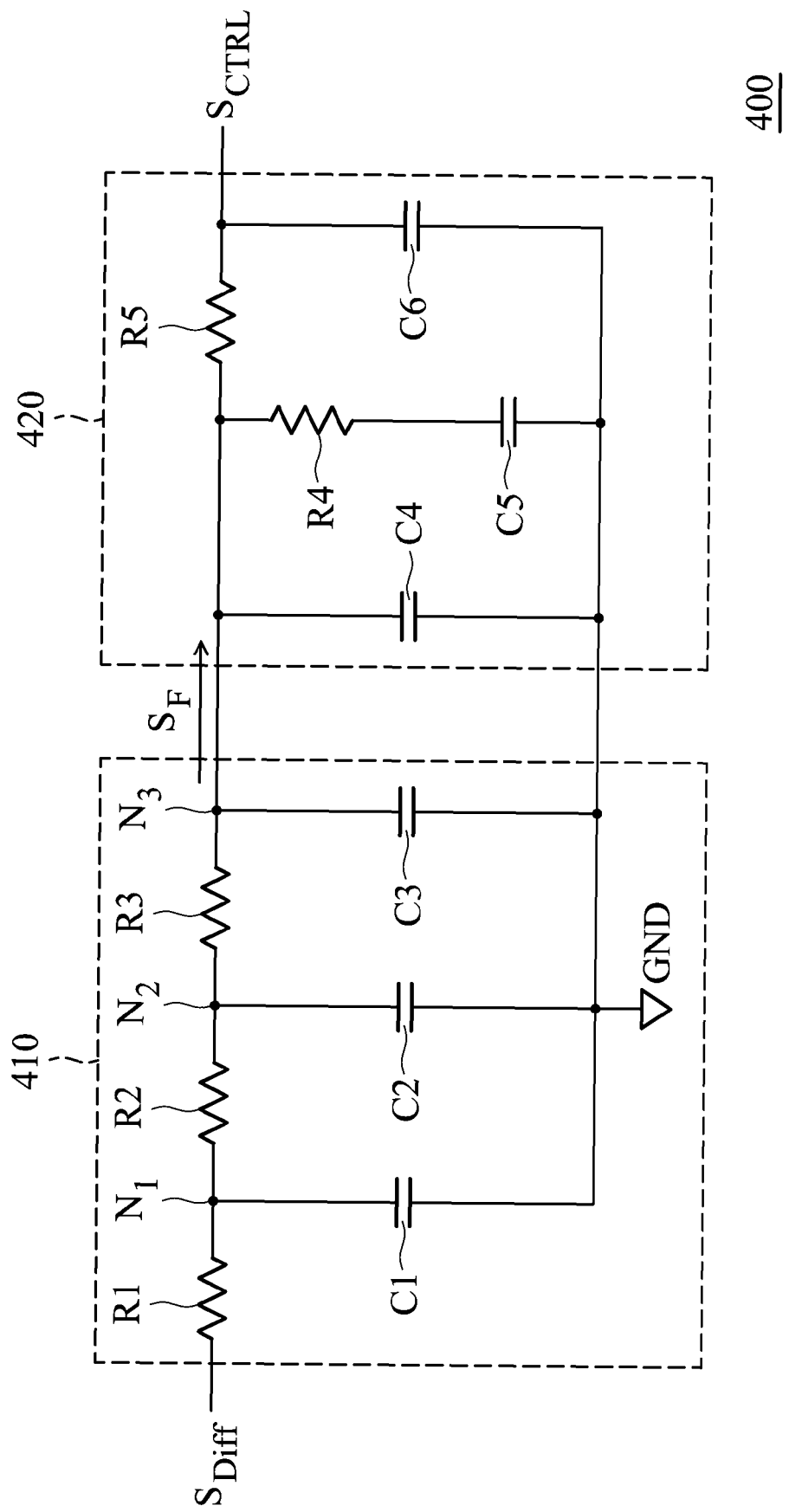
FIG. 5 shows an exemplary schematic illustrating a filtering unit according to an embodiment of the invention.
Figure 6:
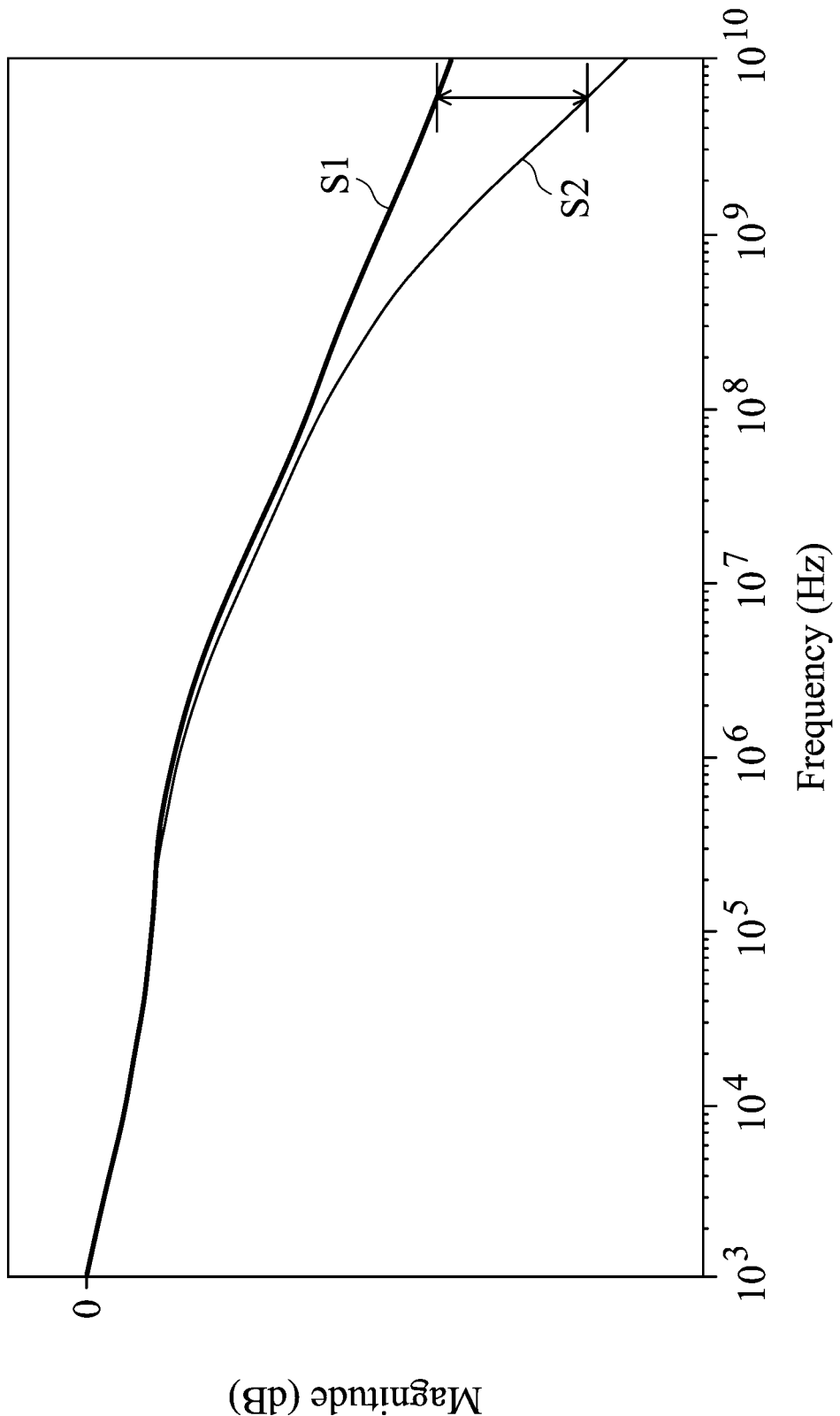
FIG. 6 shows a simulation result illustrating a Bode diagram of the filtering unit of FIG. 5.

FIG. 5 shows an exemplary schematic illustrating a filtering unit 400 according to an embodiment of the invention. The filtering unit 400 comprises a high frequency filter 410 and a low pass filter 420. The high frequency filter 410 is a $3^{rd}$ order filter that comprises three resistors R1, R2 and R3 and three capacitors C1, C2 and C3. The resistor R1 is coupled between an input terminal of the filtering unit 400 and a node $N_1$. The resistor R2 is coupled between the nodes $N_1$ and $N_2$. The resistor R3 is coupled between the nodes $N_2$ and $N_3$. The capacitor C1 is coupled between the node $N_1$ and a ground GND, the capacitor C2 is coupled between the node $N_2$ and the ground GND, and the capacitor C3 is coupled between the node $N_3$ and the ground GND. Furthermore, the low pass filter 420 comprises two resistors R4 and R5 and three capacitors C4, C5 and C6. The capacitor C4 is coupled between the node $N_3$ and the ground GND. The resistor R4 is coupled between the node $N_3$ and the capacitor C5, and the capacitor C5 is coupled between the resistor R4 and the ground GND. The resistor R5 is coupled between the node $N_3$ and an output terminal of the filtering unit 400. The capacitor C6 is coupled between the output terminal of the filtering unit 400 and the ground GND. In the filtering unit 400, the high frequency filter 410 is disposed before the resistors R4 and R5 and the capacitors C5 and C6 of the low pass filter 420, thereby the unit gain frequency and the phase margin of the filtering unit 400 are the same as the low pass filter 420. FIG. 6 shows a simulation result illustrating a Bode diagram of the filtering unit 400 of FIG. 5, wherein the curve S1 represents a transfer function of the low pass filter 420 and the curve S2 represents a transfer function of the filtering unit 400 that combines the low pass filter 420 and the high frequency filter 410. Referring to FIG. 5 and FIG. 6, a pole is provided by the high frequency filter 410 to attenuate the harmonics of the reference frequency $f_{REF}$. Furthermore, influences on the bandwidth and the phase margin of the transfer function of the filtering unit 400 are unobvious due to the pole being far away.

Figure 7:
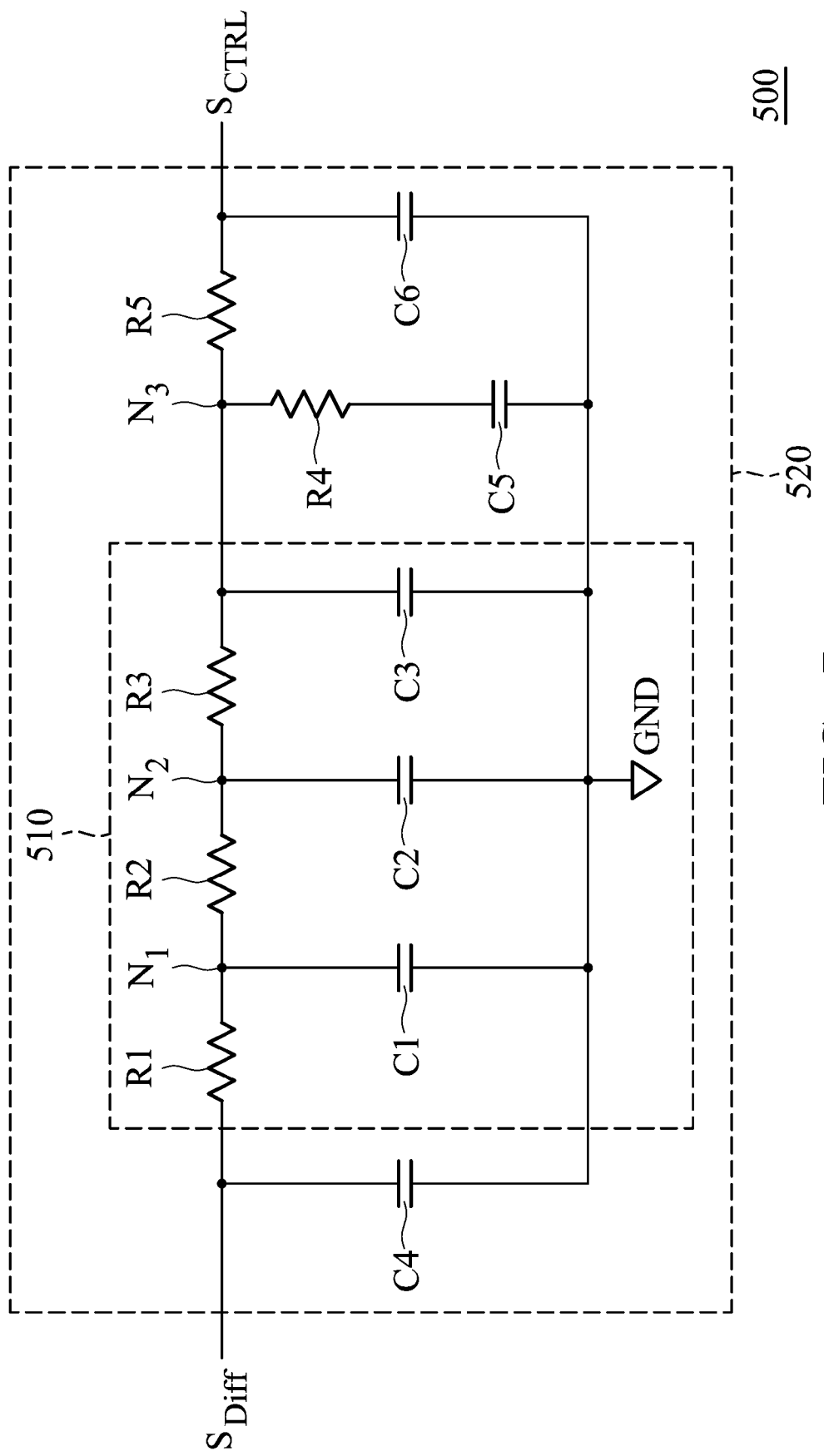
FIG. 7 shows another exemplary schematic illustrating a filtering unit according to an embodiment of the invention.

FIG. 7 shows another exemplary schematic illustrating a filtering unit 500 according to an embodiment of the invention. In the filtering unit 500, a high frequency filter 510 is implemented within a low pass filter 520. For example, compared with the capacitor C4 of the filtering unit 400 of FIG. 5, the capacitor C4 of the filtering unit 500 is disposed between an input terminal of the filtering unit 500 and the ground GND, i.e. before the high frequency filter 510. Similarly, the high frequency filter 510 is disposed before the resistors R4 and R5 and the capacitors C5 and C6 of the low pass filter 520, thereby the unit gain frequency and the phase margin of the filtering unit 500 are determined by the low pass filter 520.

Referring back to FIG. 3, the low pass filter 60 may be a conventional loop filter with a tens-hundreds KHz bandwidth for filtering noise. In general, a loop filter is implemented by I/O devices to avoid current leakage, and comprises at least one capacitor. The greater the equivalent capacitance of the loop filter is, the lesser the bandwidth of the PLL and the greater the phase margin. Meanwhile, the greater the capacitance of the loop filter is, the greater the occupied area of the capacitor. For semiconductor circuits that are implemented by advanced CMOS processes, it is difficult to shrink the area of on-chip inductors and I/O devices due to their physical structure, thus the circuit area of the semiconductor circuit is dominated by the two components.

Figure 8:
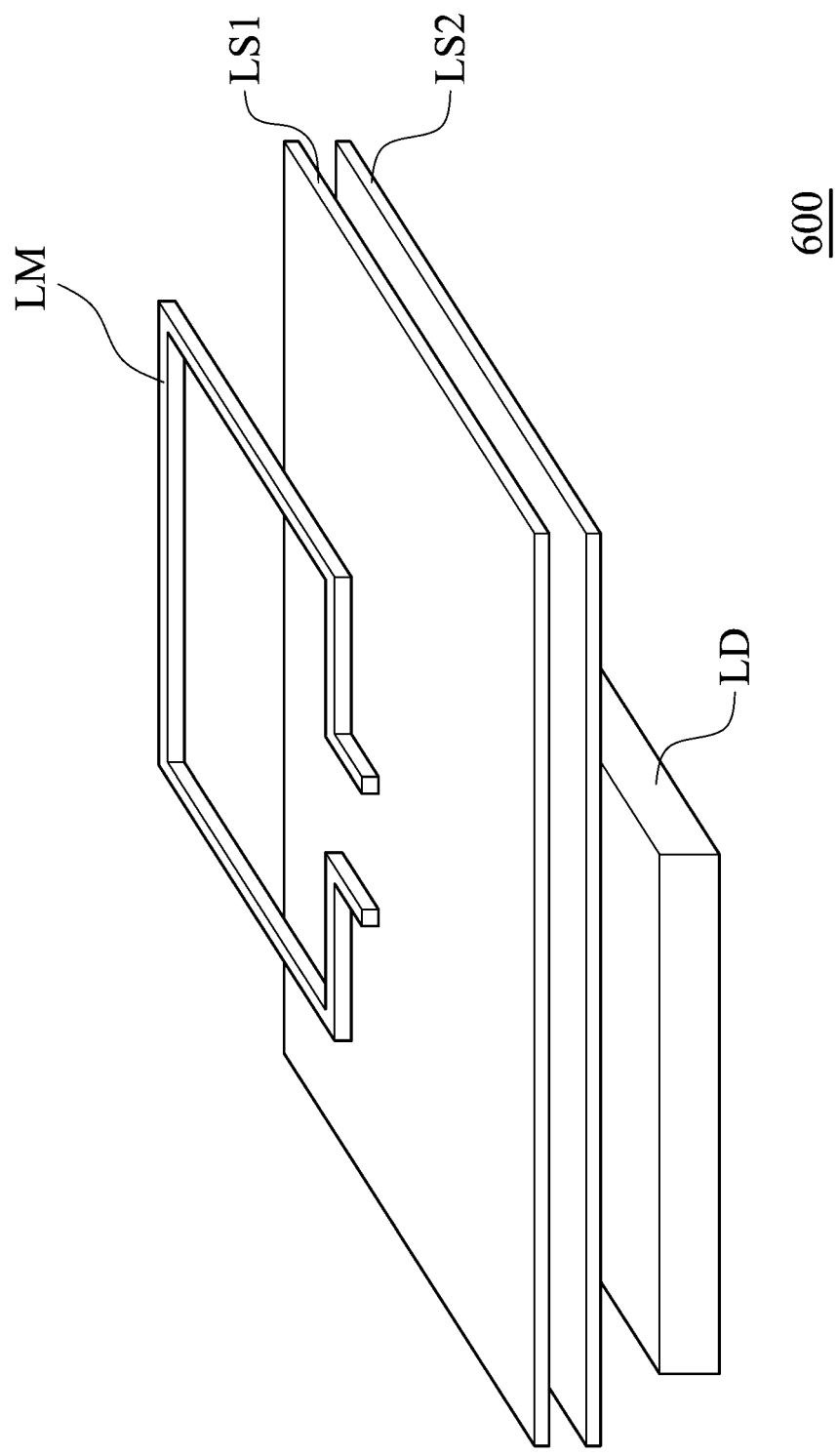
FIG. 8 shows a perspective diagram illustrating a semiconductor circuit of a PLL according to an embodiment of the invention.

FIG. 8 shows a perspective diagram illustrating a semiconductor circuit 600 of a PLL (e.g. the PLL 100 of FIG. 1) according to an embodiment of the invention, wherein the PLL is implemented in an integrated circuit (IC). In the semiconductor circuit 600, a metal layer LM forms an inductor device of an oscillator (e.g. the controlled oscillator 30 of FIG. 1) of the PLL. A conductive layer LS1 is disposed between the metal layer LM and another conductive layer LS2, wherein the conductive layer LS1 is arranged to provide a reference, such as an AC ground, for the inductor device formed by the metal layer LM. In one embodiment, the conductive layer LS1 comprises a pattern ground shield (PGS) for improving a quality factor (Q) of the inductor device. In general, the higher the Q factor of the inductor, the closer it approaches the behavior of an ideal inductor. The conductive layer LS2 is disposed between the conductive layer LS1 and a semiconductor device LD, wherein the conductive layer LS2 is arranged to provide a reference, such as an AC ground, for the semiconductor device LD.

In the embodiment, the semiconductor device LD may be any device or circuit of the PLLs such as a capacitor of a loop filter (e.g. the low pass filter 60 of FIG. 3) within the PLL. For example, the loop filter partially overlaps the oscillator in the layout for a PLL. Therefore, the semiconductor device LD is electrically coupled to the inductor formed by the metal layer LM. In one embodiment, the conductive layer LS2 may be a pattern ground shield or a normal ground plane. In one embodiment, a supplied voltage (e.g. VDD or VSS) or a predetermined voltage (e.g. a common voltage or a reference voltage) of the IC may be applied to the conductive layer LS1 and/or LS2.

Figure 9:
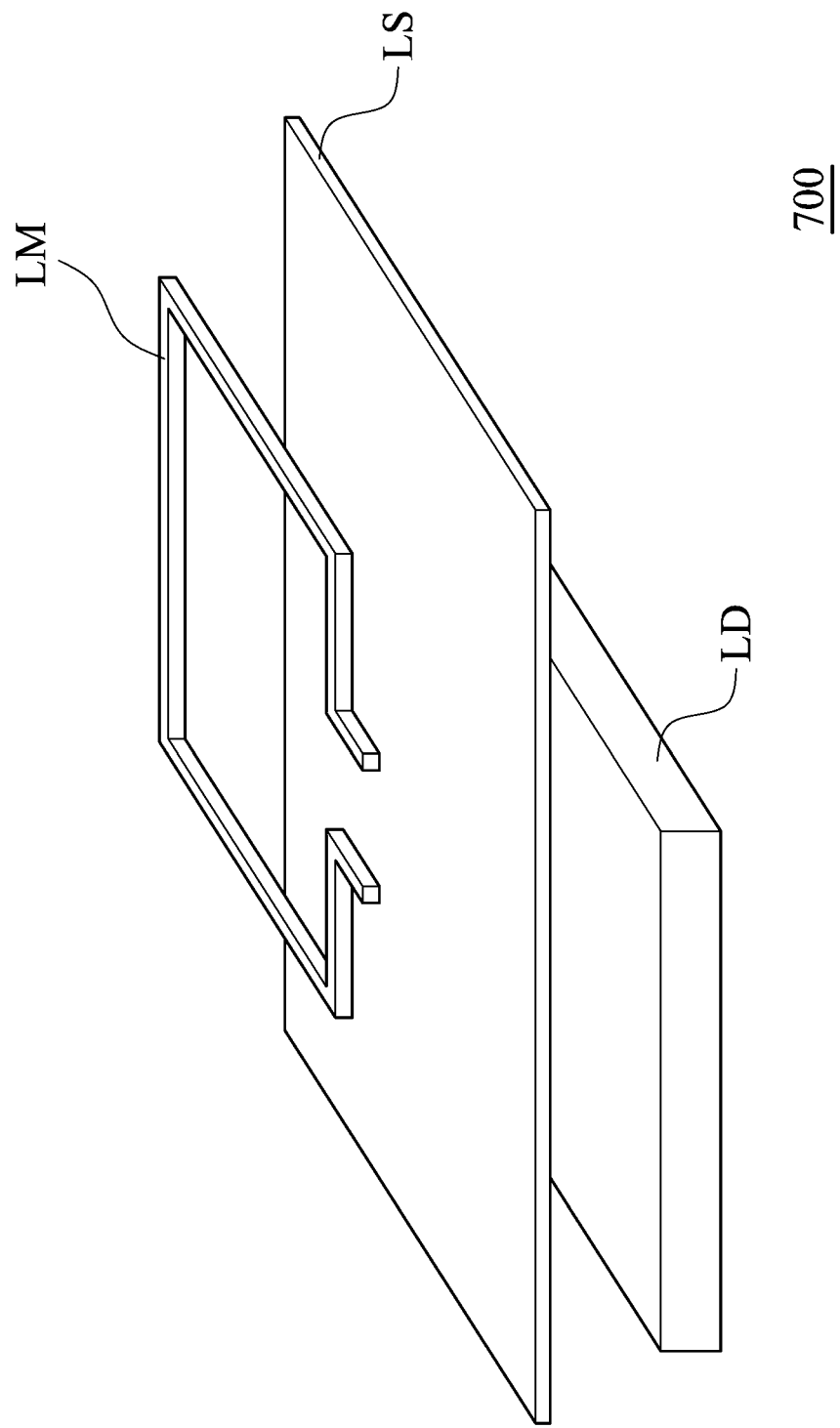
FIG. 9 shows a perspective diagram illustrating a semiconductor circuit of a PLL according to another embodiment of the invention.

FIG. 9 shows a perspective diagram illustrating a semiconductor circuit 700 of a PLL (e.g. the PLL 100 of FIG. 1) according to another embodiment of the invention, wherein the PLL is implemented in an integrated circuit. In the semiconductor circuit 700, a metal layer LM forms an inductor of an oscillator (e.g. the controlled oscillator 30 of FIG. 1) of the PLL. A conductive layer LS is disposed between the metal layer LM and a semiconductor device LD, for example, to form a shield or provide a reference between the inductor formed by the metal layer LM and the semiconductor device LD when the inductor device and the semiconductor device are working.

In the embodiment, the conductive layer LS is arranged to provide an AC ground for the inductor formed by the metal layer LM, the semiconductor device LD or both. Similarly, the semiconductor device LD may be any device or circuit among the PLLs, such as a capacitor of a loop filter (e.g. the low pass filter 60 of FIG. 3) within the PLL. For example, the loop filter partially overlaps the oscillator in the layout for a PLL. Therefore, the semiconductor device LD is electrically coupled to the inductor formed by the metal layer LM. In one embodiment, the conductive layer LS comprises a pattern ground shield for improving the Q factor of the inductor formed by the metal layer LM. In another embodiment, a supplied voltage (e.g. VDD or VSS) or a predetermined voltage (e.g. a common voltage or a reference voltage) may be applied to the conductive layer LS.

In one aspect, by disposing a low pass filter (e.g. a loop filter) or other circuits of a PLL under an inductor of oscillator of a PLL, the total area of the PLL occupied in a chip is decreased. In another aspect, a high frequency filter providing a pole is used, which is disposed before the low pass filter, so as to attenuate the harmonics caused by a reference signal of the PLL, wherein the pole is greater than a frequency of the reference signal and less than a frequency of an oscillation signal, i.e. the pole is set between the input and output frequencies of the PLL. The harmonics of the reference signal to be input to the low pass filter are attenuated, thus the spurious coupling and the Q factor degradation caused by induction between the inductor and the low pass filter disposed under the inductor are decreased. Furthermore, harmonics caused by the spurious coupling are also attenuated for the output signal of the PLL.

The semiconductor circuit 600 of FIG. 8 or the semiconductor circuit 700 of FIG. 9 implemented in a PLL is used as an example for description, and does not limit any possible applications or variations of the invention. For example, the semiconductor circuit 600 of FIG. 8 or the semiconductor circuit 700 of FIG. 9 can be implemented in the circuits using at least an inductor or a transformer in an integrated circuit, to save layout area of the integrated circuit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop, comprising:
    a detector, for generating a phase difference signal according to a reference frequency and an oscillation signal;
    a controlled oscillator, for generating the oscillation signal according to a filtered signal; and
    a filtering unit coupled between the detector and the controlled oscillator, for filtering the phase difference signal to generate the filtered signal, wherein the filtering unit comprises a high frequency filter of which a pole is greater than the reference frequency and less than a frequency of the oscillation signal,
    wherein the filtering unit comprises a low pass filter, and the low pass filter is disposed under an inductor of the controlled oscillator.

2. The phase locked loop as claimed in claim 1, wherein the high frequency filter is arranged to attenuate harmonics of the reference frequency presented in the phase difference signal.

3. The phase locked loop as claimed in claim 1, wherein the low pass filter partially overlaps the controlled oscillator in layout.

4. The phase locked loop as claimed in claim 3, wherein a capacitor of the low pass filter is disposed under an inductor of the controlled oscillator.

5. The phase locked loop as claimed in claim 4, wherein the filtering unit is arranged to attenuate spurs occurred around the frequency of the oscillation signal, so as to decrease spurious coupling caused between the inductor and the capacitor.

6. The phase locked loop as claimed in claim 1, being utilized in a frequency synthesizer.

7. The phase locked loop as claimed in claim 1, wherein the controlled oscillator is a voltage controlled oscillator or a digitally controlled oscillator.

8. A phase locked loop, comprising:
    a controlled oscillator, for providing an output signal oscillating at a determined output frequency according to a first signal;
    a divider, for dividing the output signal into a divided frequency;
    a detector, for generating a phase difference signal according to a reference frequency and the divided frequency; and
    a filtering unit, for filtering the phase difference signal to generate the first signal, wherein the filtering unit comprises a high frequency filter of which a pole is set between the reference frequency and the determined output frequency,
    wherein the filtering unit comprises a low pass filter, and the low pass filter is disposed under an inductor of the controlled oscillator.

9. The phase locked loop as claimed in claim 8, wherein the high frequency filter is arranged to attenuate harmonics of the reference frequency presented in the phase difference signal.

10. The phase locked loop as claimed in claim 8, wherein the low pass filter partially overlaps the controlled oscillator in layout.

11. The phase locked loop as claimed in claim 10, wherein a capacitor of the low pass filter is disposed under an inductor of the controlled oscillator.

12. The phase locked loop as claimed in claim 11, wherein the filtering unit is arranged to attenuate spurs occurred around the determined output frequency, so as to decrease spurious coupling caused between the inductor and the capacitor.

13. The phase locked loop as claimed in claim 8, being utilized in a frequency synthesizer.

14. The phase locked loop as claimed in claim 8, wherein the controlled oscillator is a voltage controlled oscillator or a digitally controlled oscillator.

* * * * *